United States Patent
Medina Garcia et al.

(10) Patent No.: US 11,754,604 B2
(45) Date of Patent: Sep. 12, 2023

(54) MODULAR POWER TILE AND METHOD OF OPERATING A POWER DISTRIBUTION SYSTEM

(71) Applicant: GE Aviation Systems Limited, Cheltenham (GB)

(72) Inventors: Daniela Alejandra Medina Garcia, Querétaro (MX); Luis Javier Pando Rodriguez, Querétaro (MX); Gerardo Carvajal Alcala, Querétaro (MX); Francisco Avila Alarcon, Querétaro (MX)

(73) Assignee: GE Aviation Systems Limited, Cheltenham (GB)

( * ) Notice: Subject to any disclaimer, the term of this patent is extended or adjusted under 35 U.S.C. 154(b) by 562 days.

(21) Appl. No.: 16/589,809

(22) Filed: Oct. 1, 2019

(65) Prior Publication Data
US 2020/0103445 A1    Apr. 2, 2020

(51) Int. Cl.
*G01R 27/16* (2006.01)
*G01R 31/58* (2020.01)

(52) U.S. Cl.
CPC .............. *G01R 27/16* (2013.01); *G01R 31/58* (2020.01)

(58) Field of Classification Search
CPC .... G01R 27/16; G01R 31/58; G01R 19/2513; G01R 31/11; H02J 4/00
See application file for complete search history.

(56) References Cited

U.S. PATENT DOCUMENTS

| 7,061,251 | B2* | 6/2006 | Taylor | H04B 17/103 |
| | | | | 324/642 |
| 7,868,621 | B2 | 1/2011 | Liu | |
| 8,022,711 | B2 | 9/2011 | Oldenburg | |
| 8,295,444 | B2* | 10/2012 | Dinesh | H04M 3/306 |
| | | | | 379/1.04 |
| 8,874,391 | B2* | 10/2014 | Taylor | G01R 31/2822 |
| | | | | 702/85 |
| 9,658,271 | B2 | 5/2017 | Thomas | |
| 9,746,512 | B2 | 8/2017 | Shipley | |
| 9,970,977 | B2 | 5/2018 | Furse | |

(Continued)

FOREIGN PATENT DOCUMENTS

| CN | 102043383 A | 5/2011 |
| CN | 108155714 A | 6/2018 |

(Continued)

OTHER PUBLICATIONS

European Patent Office, European Search Report re Application No. 19200653.4-1202, dated Feb. 11, 2020, 11 pages, Munich, Germany.

(Continued)

*Primary Examiner* — Robert H Kim
*Assistant Examiner* — Christopher J Gassen
(74) *Attorney, Agent, or Firm* — McGarry Bair PC

(57) ABSTRACT

A modular power tile and method of operating a power distribution system includes generating a predetermined identifying pattern, by a reflectometry module of a power distribution node, injecting, by the reflectometry module, the predetermined identifying pattern, receiving, at the reflectometry module, a reflected incident signal of the predetermined identifying pattern, and scheduling a maintenance task.

18 Claims, 3 Drawing Sheets

(56) References Cited

U.S. PATENT DOCUMENTS

| | | | |
|---|---|---|---|
| 10,926,870 B2 | 2/2021 | Halsey et al. | |
| 2004/0017208 A1* | 1/2004 | Bohley | G01R 31/11 |
| | | | 324/637 |
| 2008/0217471 A1 | 9/2008 | Liu et al. | |
| 2009/0228223 A1* | 9/2009 | Liu | G01R 31/008 |
| | | | 361/62 |
| 2014/0266238 A1* | 9/2014 | Furse | G01R 31/2841 |
| | | | 324/533 |
| 2017/0176511 A1* | 6/2017 | Moell | G01R 31/086 |
| 2018/0114382 A1 | 4/2018 | Courter | |
| 2018/0222334 A1* | 8/2018 | Compton | B60L 53/24 |
| 2019/0267833 A1* | 8/2019 | Collins | H02J 1/08 |

FOREIGN PATENT DOCUMENTS

| | | |
|---|---|---|
| EP | 2221626 A1 | 8/2010 |
| WO | 2003094765 A2 | 11/2003 |

OTHER PUBLICATIONS

Peter Thomas-Keefe, GB Combined Search and Examination Report received in related GB Application No. 1816026.7, dated Mar. 7, 2019, 2 pages.

\* cited by examiner

MODULAR POWER TILE AND METHOD OF OPERATING A POWER DISTRIBUTION SYSTEM

CROSS REFERENCE TO RELATED APPLICATION(S)

This application claims priority to and benefit of United Kingdom Patent Application No. 1816026.7, filed Oct. 1, 2018, which is incorporated herein in its entirety.

TECHNICAL FIELD

The disclosure relates to a method and apparatus for operating a power distribution system including a reflected incident signal to determine impedance network characteristics.

BACKGROUND

Cables for transmissible signals, such as power or data, provide for transmission of the transmissible signals from a source to a destination. Such cables have a variety of applications, and are well-suited for long or short distance transmission between resources or devices.

These cables are subject to damage or degradation through the life cycle of the interconnection network. For instance, wire chaffing due to wire handling during maintenance operations or wire corrosion due to a constant exposure to humidity, can result in damage or degradation. When transmission line damage or degradation occurs, locating the failure within the length span of the wire requires taking the device, application, or electrical node offline in order to provide an in ground diagnostic and repair.

BRIEF DESCRIPTION

In one aspect, the present disclosure relates to a modular power tile for a power distribution system, comprising a power input, a set of power outputs selectably connectable with a the power input by way of a respective set of power switching devices, and further connected with a set of electrical load, and a controller module having memory and configured to inject a predetermined identifying pattern onto a voltage input received at the power input, to controllably connect at least one of the set of electrical loads by controllably operating the respective one of the power switching devices such that the at least one of the set of electrical loads receives the voltage input with the identifying pattern, to receive a reflected incident signal of the voltage input with the identifying pattern, and to determine impedance network characteristics by comparing the voltage input with the identifying pattern with the reflected incident signal, and to store the determined impedance network characteristics in the memory. The injecting, connecting, receiving, and determining occurs during routine power supplying operations of the power distribution system.

In another aspect, the present disclosure relates to a power distribution system, comprising a power source supplying a voltage signal, a set of electrical loads, and a modular power tile receiving the power source at a power input and connected with the set of electrical loads at a set of power outputs and by way of a corresponding set of conductors. The modular power tile further includes a set of solid state power switches respectively associated with the set of conductors and set of electrical loads, and operably to selectively connect the power source with the respective electrical load, and a spread spectrum time domain reflectometry (SSTDR) module configured to inject a predetermined identifying pattern onto the voltage input received at the power input, to selectively operate a respective one of the power switching devices such that at least one of the set of electrical loads receives the voltage input with the identifying pattern, to receive a reflected incident signal of the voltage input with the identifying pattern, to compare the voltage input with the identifying pattern with the reflected incident signal, and to determine impedance network characteristics for at least one of the respective conductor or the respective electrical load based on the comparison. The SSTDR module operates to determine impedance network characteristics during routine power supplying operations to the respective one of the set of electrical loads.

In yet another aspect, the present disclosure relates to a method of operating an electrical network, the method comprising generating a predetermined identifying pattern, by a reflectometry module of a power distribution node, injecting, by the reflectometry module, the predetermined identifying pattern into a voltage signal provided by a power source and selectively connected with an electrical load during a routine power supplying operation of the electrical load, the selective connecting controlled by way of the power distribution node, receiving, at the reflectometry module, a reflected incident signal of the predetermined identifying pattern during the routine power supplying operation, comparing, by the reflectometry module, the predetermined identifying pattern with the reflected incident signal, determining an impedance network characteristic for at least one a conductor connecting the electrical load with the power distribution node or the electrical load, based on the comparison, and scheduling a maintenance task based on the determined impedance network characteristic.

DETAILED DESCRIPTION

Figure 1:
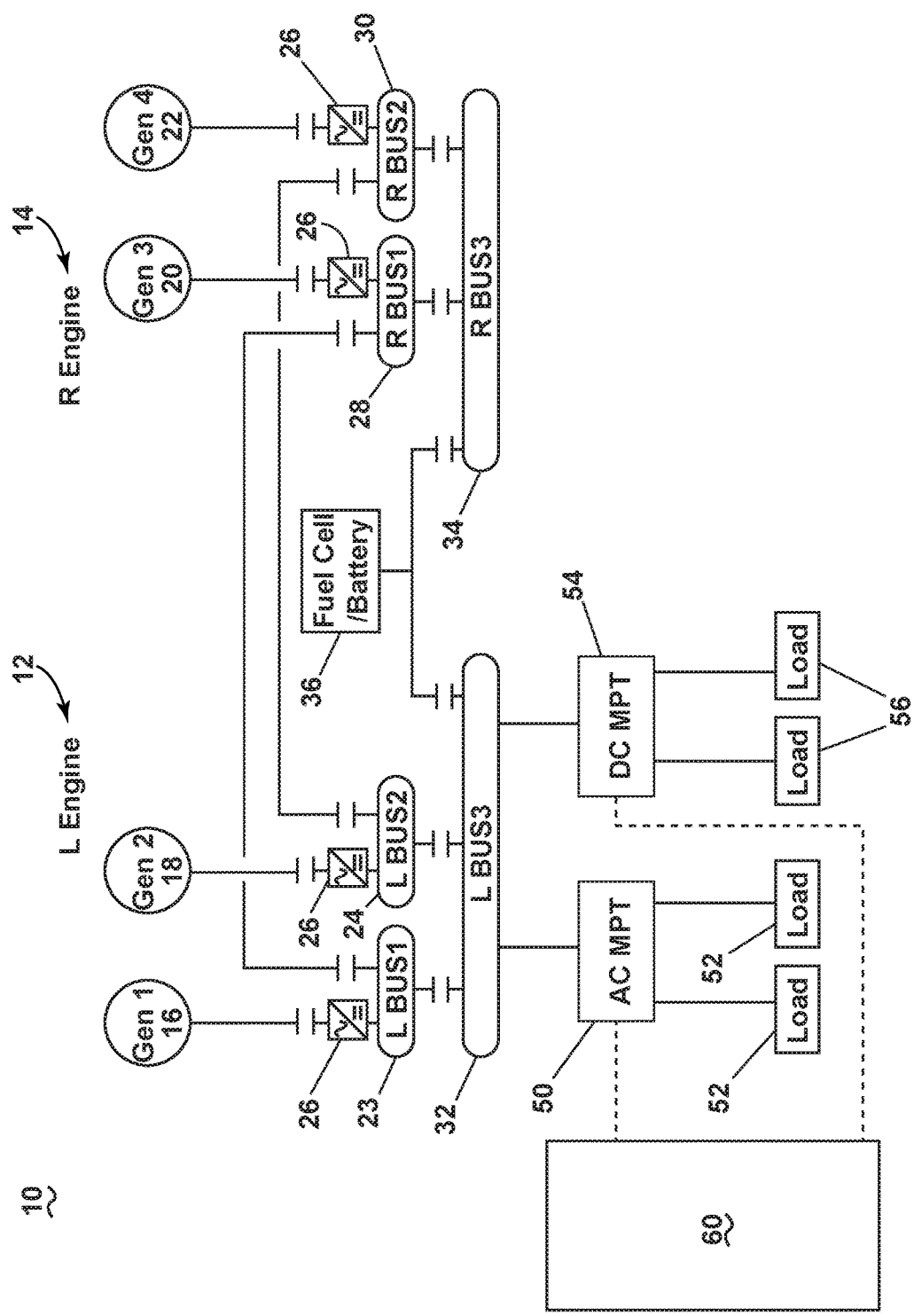
FIG. 1 is a schematic diagram of an electrical power distribution system with a modular power tile, in accordance with various aspects described herein.

The aspect of the disclosure are related to a method of identifying, detecting, predicting, locating, or the like, an electrical fault in an electrical network transmitting at least one transmissible signal, such as a power signal (e.g. a power supply signal). Any type of transmissible element is envisioned, examples of which include electrical transmissions of data. Moreover, any purpose may be served by the transmissible signal, such as providing power or data for transmittal.

While "a set of" various elements will be described, it will be understood that "a set" can include any number of the respective elements, including only one element. Also as used herein, while sensors can be described as "sensing" or "measuring" a respective value, sensing or measuring can include determining a value indicative of or related to the respective value, rather than directly sensing or measuring the value itself. The sensed or measured values can further be provided to additional components. For instance, the value can be provided to a controller module or processor, and the controller module or processor can perform processing on the value to determine a representative value or an electrical characteristic representative of said value.

All directional references (e.g., radial, axial, upper, lower, upward, downward, left, right, lateral, front, back, top, bottom, above, below, vertical, horizontal, clockwise, counterclockwise, upstream, downstream) are only used for identification purposes to aid the reader's understanding of the disclosure, and do not create limitations, particularly as to the position, orientation, or use thereof.

Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements. Non-limiting example power distribution bus connections or disconnections can be enabled or operated by way of switching, bus tie logic, or any other connectors configured to enable or disable the energizing of electrical loads downstream of the bus. Additionally, while terms such as "voltage", "current", and "power" can be used herein, it will be evident to one skilled in the art that these terms can be interrelated when describing aspects of the electrical circuit, or circuit operations.

As used herein, a "system" or a "controller module" can include at least one processor and memory. Non-limiting examples of the memory can include Random Access Memory (RAM), Read-Only Memory (ROM), flash memory, or one or more different types of portable electronic memory, such as discs, DVDs, CD-ROMs, etc., or any suitable combination of these types of memory. The processor can be configured to run any suitable programs or executable instructions designed to carry out various methods, functionality, processing tasks, calculations, or the like, to enable or achieve the technical operations or operations described herein. The program can include a computer program product that can include machine-readable media for carrying or having machine-executable instructions or data structures stored thereon. Such machine-readable media can be any available media, which can be accessed by a general purpose or special purpose computer or other machine with a processor. Generally, such a computer program can include routines, programs, objects, components, data structures, algorithms, etc., that have the technical effect of performing particular tasks or implement particular abstract data types.

As used herein, a controllable switching element, or a "switch" is an electrical device that can be controllable to toggle between a first mode of operation, wherein the switch is "closed" intending to transmit current from a switch input to a switch output, and a second mode of operation, wherein the switch is "open" intending to prevent current from transmitting between the switch input and switch output. In non-limiting examples, connections or disconnections, such as connections enabled or disabled by the controllable switching element, can be selectively configured to provide, enable, disable, or the like, an electrical connection between respective elements.

The disclosure can be implemented in any electrical circuit environment having a switch and adapted or configured to determine impedance or electrical fault characteristics in a conductor or electrical load during normal transmission operations (e.g. while the electrical circuit is powering the electrical load or while data transmission is occurring). Stated another way, the disclosure can be implemented while the electrical circuit is in operational use for its intended purpose, and the circuit does not have be "removed" for normal or routine operations to perform the determination. For example, a power distribution system in "test mode" or "maintenance operations" is not "in operational use," whereas power distribution system of an aircraft during flight and powering a set of electrical loads by way of the power distribution system is "in operational use."

A non-limiting example of an electrical circuit environment that can include aspects of the disclosure can include an aircraft power system architecture, which enables production of electrical power from at least one spool of a turbine engine, preferably a gas turbine engine, and delivers the electrical power to a set of electrical loads via at least one solid state switch, such as a solid state power controller (SSPC) switching device. One non-limiting example of the SSPC can include a silicon carbide (SiC) or Gallium Nitride (GaN) based, high power switch. SiC or GaN can be selected based on their solid state material construction, their ability to handle high voltages and large power levels in smaller and lighter form factors, and their high speed switching ability to perform electrical operations very quickly. Additional switching devices or additional silicon-based power switches can be included.

The exemplary drawings are for purposes of illustration only and the dimensions, positions, order and relative sizes reflected in the drawings attached hereto can vary.

FIG. 1 is a schematic illustration of a power distribution system 10 for an aircraft, in one aspect of the disclosure. It should be noted that aspects of the disclosure can include be any type of electrical network, where power or data is transmitted. The power distribution system 10 can include a left engine 12 section and a right engine section 14. The left engine 12 section can include a power source, shown as a first generator 16 and a second generator 18. The right engine 14 section can similarly include a power source, shown as a third generator 20 and a fourth generator 22. While four generators 16, 18, 20, 22 are shown, non-limiting aspects of the disclosure can be included wherein any number of power sources can be include, or can be adapted to generate power from energy storage mechanism or mechanical driving force. For example, the power distribution system 10 is further shown including a fuel cell or battery 36.

The generators 16, 18, 20, 22 are shown selectively connected with a respective power bus. For example, the first generator 16 can be connected with a first power bus 23 associated with the left engine 12 section ("L BUS 1"), the second generator 18 can be connected with a second power bus 24 associated with the left engine 12 section ("L BUS 2"), the third generator 20 can be connected with a third power bus 28 associated with the right engine 14 section ("R BUS 1"), and the fourth generator 22 can be connected with a fourth power bus 30 associated with the right engine 14 section ("R BUS 2").

Additionally, each respective connection between generators 16, 18, 20, 22 and power buses 23, 24, 28, 30 can include a power converter module 26, as needed. For example, if a respective power bus 23, 24, 28, 30 is a direct current (DC) power bus 23, 24, 28, 30, and the associated generator 16, 18, 20, 22 generates alternating current (AC) power, the power converter module 26 can convert the AC power output of the power source to a DC power input to the respective power bus 23, 24, 28, 30. Further non-limiting aspects of the optional power converter modules 26 can, for instance, provide voltage step-up or step-down power conversion, DC to AC power conversion or AC to DC power conversion, or AC to AC power conversion involving changes in frequency or phase, DC to DC power conversions, or switching operations to selectively enable or disable the delivery of power to particular electrical loads, depending on, for example, available power distribution supply, criticality of electrical load functionality, or aircraft mode of operation, such as take-off, cruise, or ground operations.

The power buses 23, 24, 28, 30 are further shown selectively interconnected for redundancy. For example, the first power bus 23 can be selectively connected with the third power bus 28, or with a fifth power bus 32 associated with the left engine 12 section. Additionally, the second power bus can be selectively connected with the fourth power bus 30 or with the fifth power bus 32. Similarly, each of the third and fourth power buses 28, 30 can be selectively connected with a sixth power bus 34 associated with the right engine 14 section. Furthermore, the fifth and sixth power buses 32, 34 can be selectively connected with each other, or with another power source, shown as the fuel cell or battery 36 power source. Additional interconnections between power buses 23, 24, 28, 30, 32, 34 can be included, and are not shown or described for brevity.

At least one of the power buses 23, 24, 28, 30, 32, 34, illustrated as the fifth power bus 32, can further be connected with a set of electrical loads by way of a power distribution node, such as a modular power tile. As shown, the power distribution system 10 can include an AC modular power tile 50 selectively connecting a power bus 32 with a set of AC electrical loads 52. The power distribution system 10 can also include a DC modular power tile 54 selectively connecting a power bus 32 with a set of DC electrical loads 56. Additional power distribution nodes or modular power tiles 50, 54, electrical loads 52, 56, as well as power conversion devices can be included in aspects of the power distribution system 10, and are not shown for brevity.

In one non-limiting aspect of the disclosure, each respective modular power tile 50, 54 can be communicatively connected with a maintenance system 60. In one non-limiting example, the maintenance system 60 can only be in communication with the modular power tiles 50, 54 during a predetermined or preselected period, such as during maintenance operations, or during ground operations of the aircraft.

Figure 2:
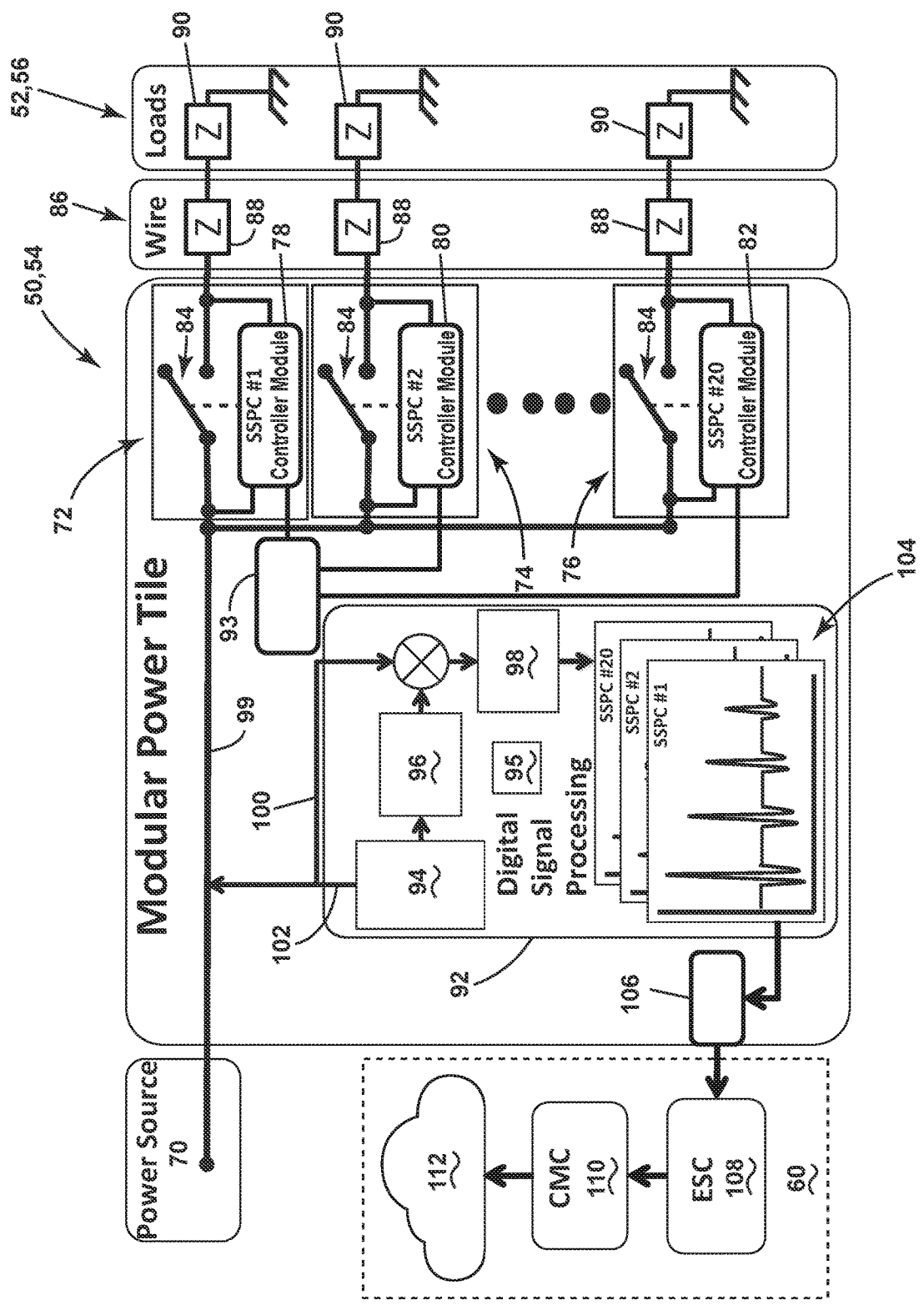
FIG. 2 is a schematic diagram of the modular power tile of FIG. 1, in accordance with various aspects described herein.

FIG. 2 illustrates a more detailed schematic view of the modular power tile 50, 54. Only a single modular power tile 50 is illustrated, but aspects of the disclosure can be applicable for either the AC modular power tile 50 or DC modular power tile 54.

As shown, the modular power tile 50, 54 can receive a power supply or voltage supply signal from a power input 99 connected with a power source 70, such as one of the power buses 23, 24, 28, 30, 32, 34 or generators 16, 18, 20, 22 of FIG. 1, or another power source. The modular power tile 50, 54 can further include a set of switching devices or switching elements, shown as a set of SSPCs. The illustration includes a first SSPC 72 having a switching element 84 and a first SSPC controller module 78, a second SSPC 74 including a switching element 84 and a second SSPC controller module 80, and a representative twentieth SSPC 76 having a switching element 84 and a twentieth SSPC controller module 82. While twenty SSPCs are schematically represented, any number of switching elements can be included in aspects of the modular power tile 50, 54.

Each respective SSPC 72, 74, 76 is shown to be connected upstream with the power source 70 input as well as downstream with a respective electrical load 52, 56 by way of a set of independent conductors 86. Each respective conductor 86 is shown to include or define a respective first impedance 88, and each respective electrical load 52, 56 is shown to include a respective second impedance 90. While first and second impedances 88, 90 are shown and described, aspect of the disclosure can be included wherein an impedance includes an inductance, a capacitance, or a combination therefore. Furthermore, non-limiting aspects of the disclosure can be included wherein the switchable operation of the set of SSPCs 72, 74, 76 selectably control the power distribution of electricity from the power source 70 to one or more respective conductors 86 and electrical loads 52, 56. In this example, the switching operations of the respective SSPC switching element 84 is controllable by way of the associated SSPC controller module 78, 80, 82. Each respective SSPC controller module 78, 80, 82 can further receive instructions from another power distribution system controller, shown as a modular power tile master controller module 93, for example, to ensure power demand operations between electrical loads 52, 56. Additional control schemas can be included.

While each SSPC 72, 74, 76 is shown associated with a single conductor 86 and a single electrical load 52, 56, non-limiting aspects of the disclosure can be included wherein a single SSPC 72, 74, 76 can controllably operate the power distribution from the power source 70 to more than one conductor 86, more than one electrical load 52, 56, or a combination thereof.

The module power tile 50, 54 further includes a reflectometry module 92, configured or adapted to enable or provide aspects of time domain reflectometry (TDR). As used herein, TDR is a method or mechanism for measuring reflections of a waveform or pattern along a conductor. TDR includes transmitting a signal (e.g. an "incident signal") onto the conductor, and then "listening," receiving, measuring, or the like, a reflection of the incident signal (e.g. a "reflected incident signal"). Based on the conductor or end point of the conductor (e.g. the electrical load), the impedance of the conductor, the end point, or a combination thereof, can be determined. One non-limiting example of TDR can include spread spectrum time domain reflectometry (SSTDR), or for example, or wherein the reflectometry module 92 includes an SSTDR module. In another non-limiting example, TDR can include sequence time domain reflectometry (STDR), or wherein the reflectometry module 92 includes an STDR module.

The reflectometry module 92 can include a pattern generator, such as a pseudo-noise code (PN code) generator 94. The PN code generator 94 can be configured or adapted to generate a predetermined identifying pattern to be sent along the power output (e.g. via line 102) to the set of SSPCs 72, 74, 76, and ultimately to at least one electrical load 52, 56 via a respective conductor 86. The reflectometry module 92 can further include a delay module 96, a summation module 98, and controller module 95 having memory. In one non-limiting example, the PN code generator 94 can operate in response to, or can be operable to generate the predetermined identifying pattern by way of the controller module 95. The reflectometry module 92 can also include a reflection line 100 configured or adapted to receive, sense, measure, or the like, a reflected incident signal. The reflected incident signal, by way of the reflection line 100, can be received by the summation module 98, along with an output from the delay module 96.

During reflectometry module 92 operations, occurring simultaneously or in cooperation with routine power supplying operations of the modular power tile 50, 54, the PN code generator 94 can generate the predetermined identifying pattern to be sent along at least one conductor 86 to an electrical load 52, 56. Non-limiting examples of the generated predetermined identifying pattern can be included wherein, for example, a voltage device (not shown) can modify the predetermined identifying pattern such that it can be delivered with the power-supplying electricity without detriment to operation of the electrical load 52, 56. For example, the predetermined identifying pattern will not cause power reset, power failure, or another erratic power supply based result on the electrical load 52, 56. Stated another way, the predetermined identifying pattern will not have any operational effect on the electrical load 52, 56. One non-limiting example can include instituting, encoding, or otherwise implementing the predetermined identifying pattern by generating a series of positive or negative voltage steps, relative to the voltage signal provided by the output of the power source 70. An example of the voltage steps can include, but is not limited to, encoding the predetermined identifying pattern using plus or minus 0.2 volts steps, relative to a 28 volt output. Additional examples can be included, and can be based on the relative power source characteristics. In this sense, the predetermined identifying pattern can be injected into the power supply received by the power source 70, and delivered to the set of SSPCs 72, 74, 76, which will subsequently deliver the voltage pattern to the electrical loads 52, 56 through the respective conductors 86.

The reflectometry module 92 can work in unison with the modular power tile master controller module 93, or with one of the SSPC controller modules 78, 80, 82 to ensure that the power supply signal with the injected predetermined identifying pattern is delivered to a specific conductor 86 or electrical load 52, 56 to be tested. In this sense, the modular power tile 50, 54 can be configured to ignore the reflected incident signal on conductors 86 or electrical loads 52, 56 not being tested (e.g. filtered, selectively de-energized by way of the respective SSPC 72, 74, 76, or the like).

The predetermined identifying pattern is delivered from line 102 to the respective SSPC 72, 74, 76, which further carries the power supply electricity with the encoded pattern along the conductor 86 to the electrical load 52, 56. Simultaneously, the predetermined identifying pattern, or a signal representative thereof, is also provided from the PN code generator 94 to the delay module 96. A reflected incident signal, at least partially related to the predetermined identifying pattern will be reflect back toward the modular power tile 50, 54 from the conductor 86, the electrical load 52, 56, or a combination thereof. The reflected incident signal will travel back through the respective SSPC 72, 74, 76 to the reflection line 100, where it will be measured or sensed and provided to the summation module 98. The summation module 98 further receives a delay module 96 output. In one non-limiting example, the delay module 96 will standby or add up a delay time before delivering the PN code generator 94 identifying pattern to the summation module 98, for instance, in order to target for a higher correlation coefficient between the predetermined identifying pattern and reflected incident signal. A higher correlation coefficient between the predetermined identifying pattern and reflected incident signal can provide, for example, a confidence level for relating a fault distance location to the delta delay of time.

The delivery of the predetermined identifying pattern on the conductor 86 and the electrical load 52, 56 will result in the modifying or altering of the predetermined identifying pattern of the reflected incident signal based on the first impedance 88 of the respective conductor 86 or the second impedance 90 of the respectively electrical load 52, 56. In this sense, the reflectometry module 92 or the controller module 95 can be configured or adapted compare the initial predetermined identifying pattern sent out via line 102 with the reflected incident signal received at line 100, and determine an impedance network characteristic of that the first impedance 88 of the respective conductor 86 or the second impedance 90 of the respectively electrical load 52, 56, or a combination thereof. In one non-limiting example, the impedance network characteristic can include scattering parameters, or "S parameters" of one or more of the aforementioned impedances 88, 90. Schematic representative reflected incident signals 104 are shown, for understanding. The impedance network characteristics can further be store in memory of the controller module 95, or later retrieval and analysis.

The reflectometry module 92 can repeat the generation and delivery of the predetermined identifying pattern, or a set of predetermined identifying patterns, along each respective SSPC 72, 74, 76, or conductor 86 and electrical load 52, 56 set to determine the impedance network characteristics for each downstream component of the modular power tile 50, 54. In non-limiting examples, the reflectometry module 92 can create a unique, or a specific SSPC 72, 74, 76 output predetermined identifying pattern, in order to distinguish certain reflected incident signals from others. In another non-limiting example, the generating, delivery, and determining of the impedance network characteristic can occur during predetermined sequences, such as during a boot up or start up sequence, or during predetermined phases or periods of time, such as during ground operations of aircraft, or during a cruise phase. Additional scheduling or repeating of the generating, delivery, and determining of the impedance network characteristic for each or a subset of the conductors 86, the electrical loads 52, 56, or a combination thereof, can be included.

The determined impedance network characteristics can be saved and stored over time in the memory of the controller module 95. During limited times, The controller module 95 can provide, transmit, or otherwise supply the stored determined impedance network characteristics to another system for further review and analysis. For example, during ground based aircraft operations, or during maintenance operations, aspects of the disclosure can be included wherein, for example, the controller module 95 can supply the determined impedance network characteristics to the maintenance system 60 by way of a communication interface 106. Non-limiting examples of the communication interface 106 can include wired communication, wireless communication, manual data transfer (e.g. via a moveable memory, such as a memory card), or the like.

The maintenance system 60 can further include, but is not limited to, an electrical system controller (ESC) 108 for receiving the determined impedance network characteristics data, which can further provide the data to a central maintenance computer (CMC) 110 or server. The data can further be provided to another system by way of the Internet or another network 112. For understanding, the maintenance system 60 is not part of the power distribution system 10, and is physically apart from and remote from the power distribution system 10. In non-limiting examples, the memory of the controller module 95 can store the determined impedance network characteristics data until the next or following connection or communication with the maintenance system 60.

The maintenance system 60, or components 108, 110, 112 thereof, can receive the determined impedance network characteristics data, and can, for example, determines present or predicted conductor 86 fault (e.g. wire arc faults), electrical load 52, 56 issues, or the like. In one non-limiting instance, the determining or predicting the faults or issues can be based upon, or correlate with the determined impedance network characteristics data. For example, a trend or change over time of the impedance network characteristic data, or a changing of the data relative to similarly-situated conductors 86 and electrical loads 52, 56 can be indicative of faults, issues, or the like. Upon the maintenance system 60 determining a fault, issue, or the like exists or is predicted to exist, the maintenance system 60 can schedule a maintenance task to be perform, such as a preventative or corrective action. Based on the maintenance task, the maintenance system 60 can ensure the maintenance action occurs or is completed.

Figure 3:
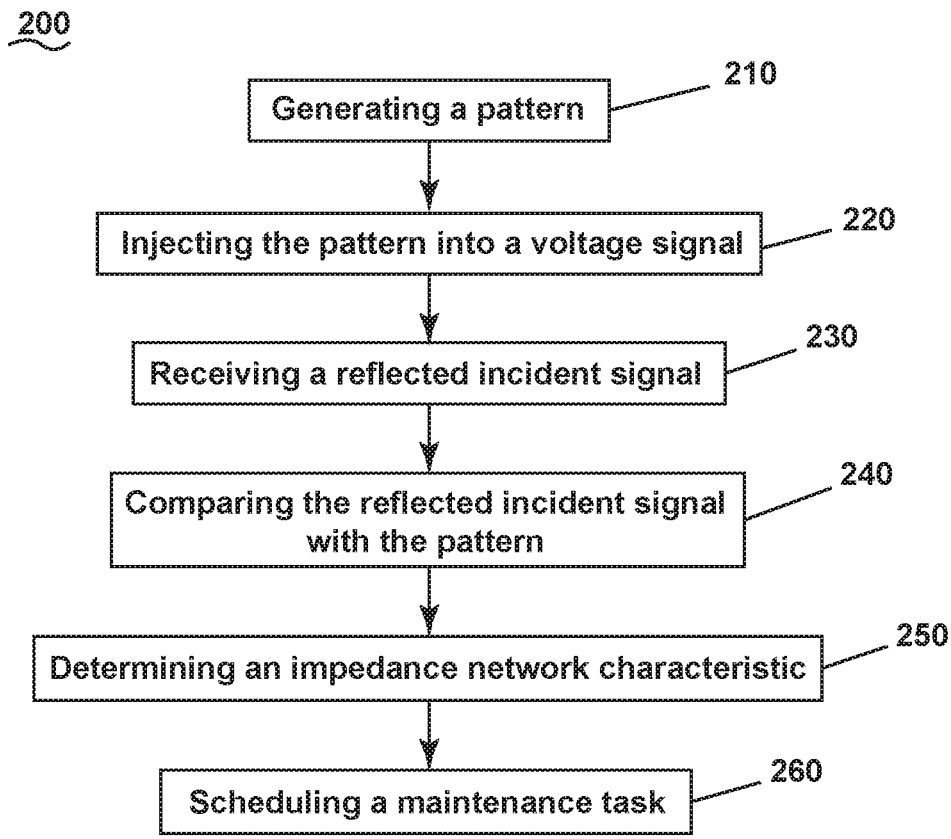
FIG. 3 is an example flow chart diagram of a method of operating the electrical power distribution system of FIG. 1, in accordance with various aspects described herein.

FIG. 3 illustrates a flow chart demonstrating a method 200 of operating an electrical network, such as the power distribution system 10. The method 200 begins by generating a predetermined identifying pattern, by the reflectometry module 92 of a power distribution node, such as the modular power tile 50, 54, at 210. Next, the method 200 includes injecting, by the reflectometry module 92, the predetermined identifying pattern into a voltage signal provided by a power source 70 and selectively connected with an electrical load 52, 56 during a routine power supplying operation of the electrical load 52, 56, the selective connecting controlled by way of the modular power tile 50, 54, at 220. Next, the reflectometry module 92 receives a reflected incident signal of the predetermined identifying pattern during the routine power supplying operation at 230.

The method 200 continues by comparing, by the reflectometry module 92, the predetermined identifying pattern with the reflected incident signal, at 240. Then, the reflectometry module 92 determines an impedance network characteristic for at least one a conductor 86 connecting the electrical load 52, 56 with the modular power tile 50, 54 or an impedance network characteristic of the electrical load 52, 56, based on the comparison, at 250. Finally, the method 200 includes scheduling a maintenance task based on the determined impedance network characteristic, at 260.

The sequence depicted is for illustrative purposes only and is not meant to limit the method 200 in any way as it is understood that the portions of the method can proceed in a different logical order, additional or intervening portions can be included, or described portions of the method can be divided into multiple portions, or described portions of the method can be omitted without detracting from the described method.

Many other possible aspects and configurations in addition to that shown in the above figures are contemplated by the present disclosure.

The aspects disclosed herein provide for determining impedance network characteristics at a power distribution node, such as a modular power tile, during normal or routine power supplying operations. Conventionally, determining impedance network characteristics includes taking the electrical network out of routine service (e.g. during a specific maintenance task, not when the aircraft or power distribution system is operating during normal power-supplying operations. The technical effect is that the above described aspects enable the cooling of said heat-generating module by way of pumping combustible fuel about the heat-generating module as a coolant. One advantage that can be realized in the above aspects is that the above described aspects focus on the digitization of products and processes that enhances the maintenance experience and decreases aircraft operation cost. Another advantage can include having a modular power tile with embedded Time Domain Reflectometer in order to capture the impedance characteristics of every wire within the power distribution network. The impedance characteristics can be subsequently stored in a ground station prognostic tool, such as a maintenance system, in order to be able to observe the impedance trend, for instance, against flight hours aiming to predict the life expectancy of either the power distribution wires or the LRUs connected to them as loads. The resulting output can further be defined to utilize providing to the maintenance personnel or maintenance tasks the location of wire faults, failures, or issues without disassembling the wire harnesses and connecting an external reflectometer.

By reducing maintenance time due to accurate prediction of issues, as well as identifying the location of issues, maintenance costs can be reduced for a fleet of aircraft. Locating such issues among kilometers of wiring harnesses is time-intensive and expensive.

To the extent not already described, the different features and structures of the various aspects can be used in combination with each other as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the disclosure, including the best mode, and also to enable any person skilled in the art to practice aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

Further aspects of the invention are provided by the subject matter of the following clauses:

1. A modular power tile for a power distribution system, including a power input, a set of power outputs selectably connectable with a the power input by way of a respective set of power switching devices, and further connected with a set of electrical loads, and a controller module having memory and configured to inject a predetermined identifying pattern onto a voltage input received at the power input, to controllably connect at least one of the set of electrical loads by controllably operating the respective one of the power switching devices such that the at least one of the set of electrical loads receives the voltage input with the identifying pattern, to receive a reflected incident signal of the voltage input with the identifying pattern, and to determine impedance network characteristics by comparing the voltage input with the identifying pattern with the reflected incident signal, and to store the determined impedance network characteristics in the memory, wherein the injecting, connecting, receiving, and determining occurs during routine power supplying operations of the power distribution system.

2. The modular power tile of any preceding clause wherein the injecting of the identifying pattern does not inhibit an energizing of the at least one of the set of electrical loads.

3. The modular power tile of any preceding clause, further comprising a communication interface, and wherein the controller module is configured to transmit the stored determined impedance network characteristics from memory to a maintenance system by way of the communication interface.

4. The modular power tile of any preceding clause wherein the controller module is configured to repeat the injecting, the controllably connecting, the receiving, the determining, and the storing for each of the set of power outputs.

5. The modular power tile of any preceding clause wherein the controller module is configured to repeat the injecting, the controllably connecting, the receiving, the determining, and the storing for the at least one of the set of electrical loads.

6. The modular power tile of any preceding clause wherein the determined impedance network characteristics include at least a set of scattering parameters.

7. The modular power tile of any preceding clause wherein the controller module is further configured for spread spectrum time domain reflectometry.

8. A method of operating an electrical network, the method including generating a predetermined identifying pattern, by a reflectometry module of a power distribution node, injecting, by the reflectometry module, the predetermined identifying pattern into a voltage signal provided by a power source and selectively connected with an electrical load during a routine power supplying operation of the electrical load, the selective connecting controlled by way of the power distribution node, receiving, at the reflectometry module, a reflected incident signal of the predetermined identifying pattern during the routine power supplying operation, comparing, by the reflectometry module, the predetermined identifying pattern with the reflected incident signal, determining an impedance network characteristic for at least one of a conductor connecting the electrical load with the power distribution node or the electrical load, based on the comparison, and scheduling a maintenance task based on the determined impedance network characteristic.

9. The method of any preceding clause, further comprising transmitting the determined impedance network characteristics to a maintenance system.

10. The method of any preceding clause, further comprising determining, by the maintenance system, at least one of a present or predicted conductor fault based on analysis of the transmitted determined impedance network characteristics.

11. The method of any preceding clause, wherein the scheduling the maintenance task includes scheduling the maintenance task by the maintenance system.

12. The method of any preceding clause, wherein the determining at least one of a present or predicted conductor fault includes determining a present or predicted conductor fault based on an identified trend in the determined impedance network characteristics.

13. The method of any preceding clause, wherein the transmitting includes transmitting the determined impedance network characteristic during non-routine operation of the electrical network.

14. The method of any preceding clause, further comprising performing the scheduled maintenance task.

15. The method of any preceding clause wherein the reflectometry module is a spread spectrum time domain reflectometry module.

16. The method of any preceding clause wherein the determined impedance network characteristic includes at least a set of scattering parameters associated with the conductor.

17. The method of any preceding clause, further comprising determining a location related to the determined impedance network characteristic, and wherein the scheduled maintenance task is further based on the location.

18. A power distribution system, including a power source supplying a voltage signal, a set of electrical loads, and a modular power tile receiving the power source at a power input and connected with the set of electrical loads at a set of power outputs and by way of a corresponding set of conductors, the modular power tile further including a set of solid state power controllers respectively associated with the set of conductors and set of electrical loads, and operably to selectively connect the power source with the respective electrical load and a spread spectrum time domain reflectometry (SSTDR) module configured to inject a predetermined identifying pattern onto the voltage input received at the power input, to selectively operate a respective one of the power switching devices such that at least one of the set of electrical loads receives the voltage input with the identifying pattern, to receive a reflected incident signal of the voltage input with the identifying pattern, to compare the voltage input with the identifying pattern with the reflected incident signal, and to determine impedance network characteristics for at least one of the respective conductor or the respective electrical load based on the comparison, wherein the SSTDR module operates to determine impedance network characteristics during routine power supplying operations to the respective one of the set of electrical loads.

19. The power distribution system of any preceding clause, wherein the determined impedance network characteristic includes at least a set of scattering parameters associated with the conductor.

20. The power distribution system of any preceding clause wherein the injecting of the predetermined identifying pattern does not inhibit an energizing of the at least one of the set of electrical loads.

What is claimed is:

1. A modular power tile for a power distribution system, comprising:
   a power input;
   a plurality of power switching devices;
   a set of power outputs, each power output being selectably connectable with the power input by way of a respective power switching device of the plurality of power switching devices, and further connected with a set of electrical loads;
   a reflectometry module including a delay module, a summation module, a reflection line, and a code generator configured to create a respective specific predetermined identifying pattern for each power switching device of the plurality of power switching devices; and
   a controller module having a memory and configured to inject the respective specific predetermined identifying pattern onto a voltage input received at the power input, and to controllably provide the voltage input to at least one of the set of electrical loads by controllably operating a respective one power switching device of the plurality of power switching devices such that the at least one of the set of electrical loads receives the voltage input with the respective specific predetermined identifying pattern that is specific to its respective power switching device, the controller module further configured to receive a reflected incident signal of the voltage input with the respective specific predetermined identifying pattern, and to determine impedance network characteristics by comparing the voltage input having the respective specific predetermined identifying pattern with the reflected incident signal, and to store the determined impedance network characteristics in the memory; and wherein the summation module receives the respective specific predetermined identifying pattern from the delay module after a delay time to obtain a correlation coefficient between the respective specific predetermined identifying pattern and reflected incident signal.

2. The modular power tile of claim 1 wherein the injecting of the respective specific predetermined identifying pattern does not inhibit an energizing of the at least one of the set of electrical loads.

3. The modular power tile of claim 1, further comprising a communication interface, and wherein the controller module is configured to transmit the stored determined impedance network characteristics from the memory to a maintenance system by way of the communication interface.

4. The modular power tile of claim 1 wherein the determined impedance network characteristics include at least a set of scattering parameters.

5. The modular power tile of claim 1 wherein the controller module is further configured for spread spectrum time domain reflectometry.

6. A method of operating an electrical network, the method comprising:

generating a set of predetermined identifying patterns by a reflectometry module of a power distribution node, the reflectometry module including a delay module, a summation module, a reflection line, and a code generator, each predetermined identifying pattern being respectively specific to a power switching device from a set of power switching devices disposed on a common modular power tile;

injecting, by the reflectometry module, at least one predetermined identifying pattern into a voltage signal provided by a power source, the power source being selectively connected via a respective power switching device with an electrical load during a routine power supplying operation of the electrical load, the selective connecting controlled by way of the power distribution node;

receiving, by the delay module, a reflected incident signal of the at least one respective specific predetermined identifying pattern during the routine power supplying operation;

receiving, by the summation module, the reflected incident signal of the at least one predetermined identifying pattern from the delay module after a delay time to obtain a correlation coefficient between the respective specific predetermined identifying pattern and reflected incident signal;

comparing, by the reflectometry module, the at least one predetermined identifying pattern with the reflected incident signal;

determining an impedance network characteristic for at least one conductor connecting the electrical load with the power distribution node or determining an impedance network characteristic for the electrical load, based on the comparing; and scheduling a maintenance task based on the determined impedance network characteristic.

7. The method of claim 6, further comprising transmitting the determined impedance network characteristic to a maintenance system.

8. The method of claim 7, further comprising determining, by the maintenance system, at least one of a present or predicted conductor fault based on analysis of the transmitted determined impedance network characteristic.

9. The method of claim 8, wherein the scheduling of the maintenance task includes scheduling of the maintenance task by the maintenance system.

10. The method of claim 8, wherein the determining at least one of a present or predicted conductor fault includes determining a present or predicted conductor fault based on an identified trend in the determined impedance network characteristic.

11. The method of claim 7, wherein the transmitting includes transmitting the determined impedance network characteristic during non-routine operation of the electrical network.

12. The method of claim 6, further comprising performing the scheduled maintenance task.

13. The method of claim 6 wherein the reflectometry module is a spread spectrum time domain reflectometry module.

14. The method of claim 6 wherein the determined impedance network characteristic includes at least a scattering parameter associated with the conductor.

15. The method of claim 6, further comprising determining a location related to the determined impedance network characteristic, and wherein the scheduled maintenance task is further based on the location.

16. A power distribution system, comprising:
a power source supplying a voltage signal;
a set of electrical loads; and
a modular power tile receiving the voltage signal at a power input and connected with the set of electrical loads at a set of power outputs and by way of a corresponding set of conductors, the modular power tile further comprising:
a set of power switching devices disposed on the modular power tile and respectively associated with the set of conductors and the set of electrical loads, and operable to selectively connect the power source with the set of electrical loads; and
a spread spectrum time domain reflectometry (SSTDR) module including a delay module, a summation module, a reflection line, and a code generator, the SSTDR module configured to create a respective specific predetermined identifying pattern for each respective power switching device of the set of power switching devices, and to inject the respective specific predetermined identifying pattern onto the voltage signal received at the power input, to selectively operate a respective one of the power switching devices such that at least one of the set of electrical loads receives the voltage signal having the respective specific predetermined identifying pattern that is specific to its respective power switching device, to receive a reflected incident signal of the voltage signal with the respective specific predetermined identifying pattern, wherein the summation module is configured to receive the respective specific predetermined identifying pattern from the delay module after a delay time to obtain a correlation coefficient between the respective specific predetermined identifying pattern and reflected incident signal, to compare the voltage signal having the respective specific identifying pattern with the reflected incident signal, and to determine impedance network characteristics for at least one of the respective set of conductors or the at least one of the set of electrical loads based on the comparison; and wherein the SSTDR module operates to determine impedance network characteristics during routine power supplying operations to the at least one of the set of electrical loads.

17. The power distribution system of claim 16, wherein the determined impedance network characteristics include at least a set of scattering parameters associated with the at least one of the respective set of conductors.

18. The power distribution system of claim 16 wherein the injecting of the respective specific predetermined identifying pattern does not inhibit an energizing of the at least one of the set of electrical loads.

\* \* \* \* \*

UNITED STATES PATENT AND TRADEMARK OFFICE
CERTIFICATE OF CORRECTION

| | | |
|---|---|---|
| PATENT NO. | : 11,754,604 B2 | Page 1 of 1 |
| APPLICATION NO. | : 16/589809 | |
| DATED | : September 12, 2023 | |
| INVENTOR(S) | : Daniela Alejandra Medina Garcia et al. | |

It is certified that error appears in the above-identified patent and that said Letters Patent is hereby corrected as shown below:

On the Title Page

(30) Foreign Application Priority Data insert --Oct. 1, 2018 (UK) 1816026.7--

In the Claims

Column 14, Claim 14, Line 31: Insert --at least one-- before "conductor."

Signed and Sealed this
Fifth Day of November, 2024

Katherine Kelly Vidal
*Director of the United States Patent and Trademark Office*